United States Patent [19]

Hillenius et al.

[11] Patent Number: 4,554,726

[45] Date of Patent: Nov. 26, 1985

[54] CMOS INTEGRATED CIRCUIT TECHNOLOGY UTILIZING DUAL IMPLANTATION OF SLOW AND FAST DIFFUSING DONOR IONS TO FORM THE N-WELL

[75] Inventors: Steven J. Hillenius, Bethlehem, Pa.; Louis C. Parrillo, Warren, N.J.

[73] Assignee: AT&T Bell Laboratories, Murray Hill, N.J.

[21] Appl. No.: 601,353

[22] Filed: Apr. 17, 1984

[51] Int. Cl.$^4$ .................... H01L 21/22; H01L 21/265
[52] U.S. Cl. .................................. 29/571; 29/576 B;
    29/577 C; 29/578; 148/1.5; 148/187; 148/190;
    148/191; 148/DIG. 53; 148/DIG. 70;
    148/DIG. 117; 357/23.11; 357/23.12; 357/42;
    357/52
[58] Field of Search ................ 29/571, 578, 576 B,
    29/577 C; 148/1.5, 187, 190, 191, DIG. 70,
    DIG. 53, DIG. 117; 357/23.11, 42, 23.12, 52

[56] References Cited

U.S. PATENT DOCUMENTS

| | | | |
|---|---|---|---|
| 3,418,180 | 12/1968 | Ku | 148/187 |
| 3,865,654 | 2/1975 | Chang et al. | 29/571 X |
| 4,013,484 | 3/1977 | Boleky et al. | 148/1.5 |
| 4,132,573 | 1/1979 | Kraft | 148/191 X |
| 4,406,710 | 9/1983 | Davies et al. | 148/1.5 |
| 4,420,344 | 12/1983 | Davies et al. | 148/1.5 |
| 4,434,543 | 3/1984 | Schwabe et al. | 29/576 B |
| 4,442,591 | 4/1984 | Haken | 29/571 |
| 4,459,741 | 7/1984 | Schwabe et al. | 29/576 B |
| 4,466,171 | 8/1984 | Jochems | 29/571 |
| 4,505,027 | 3/1985 | Schwabe et al. | 29/577 C |

OTHER PUBLICATIONS

Patent Application-Ser. No. 365,396-L. C. Parrillo, now 4,435,895, G. W. Reutlinger, L. Wang-Case 2-3-1, filed 4/5/82.
Patent Application-Ser. No. 508,923-L. C. Parrillo, R. S. Payne-Case 3-6, (Cont.In-Part of Case 1-5)-filed 6/29/83, now 4,435,896.

Primary Examiner—William G. Saba
Attorney, Agent, or Firm—Arthur J. Torsiglieri; Lucian C. Canepa

[57] ABSTRACT

To minimize the number of independent masking operations in the manufacture of a CMOS integrated circuit device using twin tub technology, the n-tub is made by separate phosphorus and arsenic implants through a common mask, and the p-tub is made by two separate boron implants through a common mask, complementary to that used for forming the n-tub. One of the boron implants occurs before, the other after, the drive-in heating step. After tub formation, further movement of the implanted ions is kept small by use of a high pressure process for growing the field oxide and by only limited further heating. Transistors are then formed in the tubs.

9 Claims, 11 Drawing Figures

CMOS INTEGRATED CIRCUIT TECHNOLOGY UTILIZING DUAL IMPLANTATION OF SLOW AND FAST DIFFUSING DONOR IONS TO FORM THE N-WELL

TECHNICAL FIELD

This invention relates to integrated circuits and, more particularly, to integrated circuits which include both p-channel and n-channel MOS transistors, now generally known as complementary MOS (CMOS) integrated circuits.

BACKGROUND OF THE INVENTION

The trend in integrated circuits is towards increasing the density of circuit elements in a single chip. This means decreasing the size of individual elements and the spacing betwen individual elements. To provide improved isolation between adjacent elements and contiguous tubs, it is often desirable to provide channel stops, which are regions of relatively high doping, typically under the thick field oxide which overlies passive portions of the chip.

It is characteristic of the manufacture of integrated circuits, and, particularly of high density integrated circuitry, that the simpler the processing, the higher the yield of good chips from a starting wafer of semiconductor material, and so the lower the cost of individual chips.

The present invention in one aspect relates to a process of manufacture of CMOS circuit devices of high density, which requires fewer registrations of masking operations than prior art processes for the manufacture of comparable devices, and in another aspect to the CMOS circuit devices which result from such processing. The fewer registrations result either from the multiple use of the same mask, or from a self-alignment technique that permits the formation of one mask by the use of an earlier formed mask without need of a further alignment.

As is known to workers in the art, the manufacture of integrated circuit devices involves the selective introduction into localized regions of a semiconductive wafer of particular conductivity-type determining impurities, generally known as donor or acceptor ions. The most prevalent technique for such introduction is ion implantation in which chosen ions are accelerated by applied electric fields to penetrate into the interior of the chip. The depth and number of implanted ions are initially controlled by the parameters of the ion beam, and the implantation is localized by the use of apertured masks in the path of the ions, typically layers on the wafer. Later heating is often used to drive the ions deeper.

SUMMARY OF THE INVENTION

As previously mentioned, the present invention in one aspect is a process which involves relatively few registrations or alignments of masks. The fewer the masks that need to be separately aligned, the easier the problem of assuring proper alignment of the successive masks with respect to one another. In the process of the present invention, separately aligned masking operations are used to control more than a single implantation, whereby fewer alignments are needed for a given number of separate implantations. In particular, the present invention involves a particular sequence of ion implantations that makes it feasible to use the same mask for multiple implantations to achieve an advantageous distribution of impurities in the wafer. The distribution is designed to permit suitable threshold values for the individual transistors and adequate isolation of adjacent transistors.

In particular, the process employs essentially the same implantation steps used to dope the active tub regions for doping the field, or chanstops, regions, thereby avoiding the need for separate masking operations.

Moreover, to permit increased control of the distribution and to minimize uncontrolled movement once the desired distribution is reached, the process employs a high-pressure, short thermal cycle, oxidation step for forming the thick oxide field region overlying the passive portions of the chip.

The invention is of particular interest with CMOS circuits which are based on a technology which is widely known as the twin-tube technology. In this technology, a semiconductor chip, typically of monocrystalline silicon, which includes on its active surface a layer which is weakly doped to be uniformly of relative high resistivity of a given conductivity type, is treated to form localized more heavily doped p- and n-type surface layers or tubs. Usually the tubs are contiguous with one another so that the entire active surface is part of either a p- or an n-tub. Subsequently, p-channel transistors are formed in the n-tubs and n-channel transistors in the p-tubs.

In this technology, the dopings associated with the tubs and the source and drain regions of the transistors are generally formed by a series of ion implantation steps. Moreover, to achieve desirable threshold voltages for the transistors and to ensure adequate isolation between transistors, there is required particular depth and density profiles for the implanted ions as well as selective distribution over the surface. It is characteristic of the process of the invention that double implants through a common mask are used with each tub to achieve a particular profile of dopants in each tub, and that after such implant and initial drive-in there is avoided any process step that substantially affects the distribution in the region where chanstops are to be formed. In particular, there is employed a high pressure, low thermal cycle step to form the relatively thick field oxide whereby there is formed under the oxide a desired localized high concentration of impurities with little lateral diffusion.

In the preferred process embodiment, after the formation of an appropriate mask which protects the region in which a p-tub is desired, the unprotected chip is implanted with both relatively immobile arsenic or antimony and relatively mobile phosphorus ions. Then after forming a complementary thick oxide mask selectively over the implanted region in a way that avoids the need for a further separate alignment step and then removing the original mask over the previously implanted regions, the chip is implanted with boron ions. This is then followed by a heating step to drive the various implanted ions essentially to their desired final positions, thereby defining geometry of the p-type and n-type tubs. Still using the mask of the first boron implantation, there follows a second relatively shallow implantation of boron ions, and this implant serves primarily to ensure that there will be adequate doping near the surface where the field oxide to be formed extends over the p-tub. Then after there is appropriately masked the active regions of the various tub regions where transistors are to be formed and the field oxide is to be avoided, the chip is subjected to a high-pressure, low-thermal cycle, oxidation step for forming the thick oxide over the unmasked regions.

At the end of such processing, there is available a chip which is provided with contiguous p-type and n-type tubs in which the dopants have advantageous profiles and whose surface includes a thick field oxide except for those regions where transistors are to be formed; and in regions of the chip underlying the thick field oxide, there is a dopant concentration adequate to serve as chanstops for the desired isolation of the transistors.

Thereafter, the further processing for forming the transistors in the tubs can take a variety of forms, including ways known to workers in the art. In the preferred embodiment, the formation of the source and drain regions follows standard self-aligned silicon gate technology; but novel processing is used to form the gates. To this end, the gate electrodes of both types of transistors are of boron-doped p-type polysilicon but an earlier shallow arsenic implant into the active region of the p-tubs is performed to permit this material to serve as the gate electrode for both n-type and p-type channel transistors while maintaining the threshold voltage equal in magnitude but opposite in sign for the two types of transistors.

DETAILED DESCRIPTION

With reference now more specifically to a preferred embodiment of the invention, there is first prepared the contiguous twin tub structure characteristic of the preferred form of the invention.

One advantageously begins with a monocrystalline silicon wafer or slice which is sufficiently thick to be conveniently handled, typically about 25 mils thick. Moreover, such a wafer may have a diameter of five or six inches. As is known to workers in the art, the wafer is processed in a manner to later permit it to be diced into a large number, e.g., a hundred, of identical chips, each of which would constitute a separate integrated circuit device. Moreover, each such chip might comprise large numbers of both n-type tubs and p-type tubs, and each tub would include one or more individual transistors. For purpose of exposition, it will be desirable to focus our discussion on a limited surface portion of the wafer large enough to include only one complete n-type tub, one complete p-type tub, and portions of the adjacent tubs of a single chip. Moreover, it will be convenient to depict the case in which each tub will include only one transistor, whereas more normally a particular tub would include more than one transistor.

Figure 1:
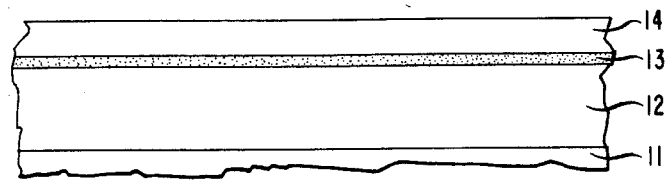
FIGS. 1-11 show in cross section a portion of a chip corresponding essentially to twin contiguous tubs at various stages of a process in accordance with the preferred embodiment of the invention. To facilitate exposition, the drawing is not to scale.

As shown in FIG. 1, the wafer comprises a substrate portion 11 which is relatively highly doped and a thinner surface portion 12 which is relatively lightly doped. Portion 12 advantageously is a layer which has been grown epitaxially and it will constitute the active portion of the wafer wherein will be formed the n-type and p-type tubs.

It is essentially a matter of convenience whether one starts with p-type or n-type wafers so long as the thinner portion 12 is weakly doped; but for purposes of example, it will be assumed that thicker layer 11 is heavily doped n-type (designated n+) and thinner layer 12 is weakly doped n-type (designated n−). The use of a lightly doped layer on a heavily doped substrate is known to be desirable to minimize latchup, which is a known problem of CMOS devices.

The process continues with the formation of the p- and n-type tubs in the top portion of layer 12, and then proceeds to the definition of the active regions of the tubs where transistors are to be formed. Thick field oxide is formed over the passive regions between these active regions. As is known, it is desirable that the doping level underlying the field oxide be appropriately high so that undesirable inversions not occur there. On the other hand, at the interface between tubs of opposite type, it is important that the doping levels not be so high that the breakdown voltage of the resulting p-n junction is so low that operation suffers. Even more importantly, it is desirable to avoid excessive doping of the tubs to ensure that in the final device the source/substrate and drain/substrate capacitances not be excessive. These contradictory requirements make it important that good control be achieved of the doping levels in the tubs, particularly along the p-n junctions formed between the tubs. In the past, to ensure the desired doping levels, it was usual to use several separately masked implants to provide the desired degree of control. In particular, separate implantations were used to dope the field regions and active regions. It is a characteristic of the inventive process that a single masking alignment is used to control the formation of the twin tubs and the field regions or chanstops. levels at the interfaces of the tubs.

For forming the twin tubs in this layer 12, there is first formed a thin oxide layer 13 (shown stippled) approximately 350 Angstroms thick over its surface and this oxide layer is covered, in turn, with a thin silicon nitride layer 14 approximately 1200 Angstroms thick. The use of the initial silicon oxide layer is known to minimize stresses in the underlying silicon. Various known techniques can be used for the formation of such dual layers. Next there is deposited over the nitride layer a suitable photoresist 15 which is patterned by known lithographic techniques to leave openings 16, exposing those regions which are to be implanted with donor ions to serve as n-tubs while leaving masked those regions which are to serve as the p-type tubs. Before the implantation, it is desirable to remove at least the portions of the silicon nitride layer exposed by openings 16 in the photoresist to facilitate penetration by the implanted ions. It is optional whether there is also removed the exposed silicon oxide. Known techniques can be used for such removals.

Figure 2:
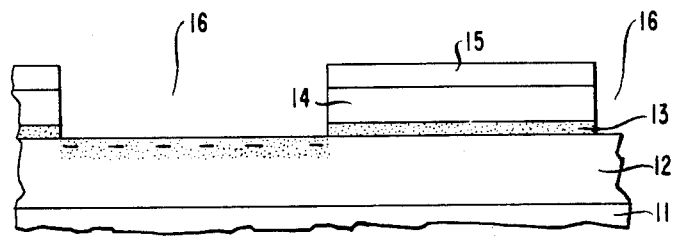

In accordance with one feature of the invention, two different donor ions are implanted for forming the n-type tubs. Typically, first there is implanted a dose of arsenic ions and this is followed by a dose of phosphorus ions, although it is relatively immaterial which is deposited first. Alternatively, antimony ions may be substituted for the arsenic ions. In a specific embodiment, each dose has a flux equal to $2 \times 10^{12}$ ions per square centimeter and is implanted with an accelerating voltage of about 100 k. electron volts. Although the two dosages are initially equal, the arsenic, which diffuses slowly in silicon, will, even after the later drive-in heating cycle, move only little both vertically and laterally in the wafer and so eventually will form a heavily doped surface layer of the n-tubs. The phosphorus, which diffuses rapidly in silicon, will, after the drive-in heating, ultimately form a deeper more lightly doped portion of the n-tubs. The implanted ions are denoted by the negative signs in the exposed portions of layer 12. The resultant is seen in FIG. 2.

After the implantation of the donor ions and the stripping of the photoresist, wafer is again subjected to an oxidizing atmosphere to grow thermally a thick oxide layer about 4000 Angstroms thick over the exposed regions corresponding to the openings 16. If the silicon nitride had not previously been removed from regions 16, it is removed before such treatment so as not to impede the oxidation of such regions.

Figure 3:
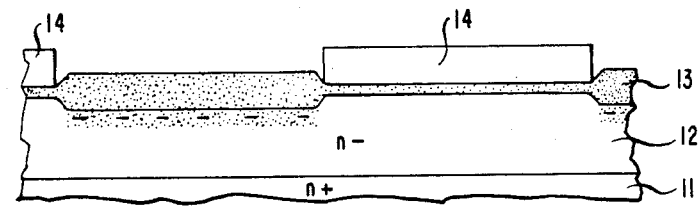

The portions of oxide layer 13 which are covered by silicon nitride will be little affected by this oxidation step because of such covering, so the oxide layer will grow only over the exposed regions. Because such growth uses the underlying silicon to form the oxide, there will result differences in the thicknesses of the layer 12 located at the edges of the openings 16. These steps will eventually correspond to the interfaces between the n-type and p-type tubs and will give rise to ledges at the wafer surface useful as a reference in subsequent registrations. The resultant is shown in FIG. 3.

Figure 4:
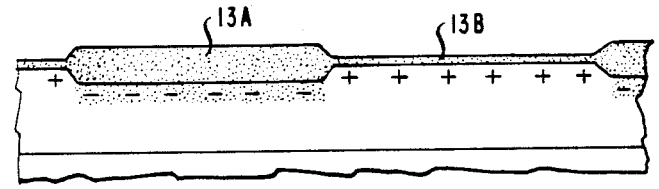

Then there is stripped the silicon nitride remaining on the surface to leave the wafer covered only by silicon oxide as seen in FIG. 4. The oxide layer comprises thick portions, now numbered 13A, overlying regions of the wafer where phosphorus and arsenic ions are implanted and thin portions now numbered 13B overlying regions of the wafer previously shielded from these implantations. This structure is now exposed to implantation with boron ions at a dosage of $2 \times 10^{12}$ ions per square cm with an accelerating field of 30 k. electron volts. This voltage is chosen to permit adequate penetration by the boron of the relatively thin oxide 13B and little penetration of the relatively thick oxide 13A. This results in boron ions being implanted selectively in the surface portions of layer 12 which had not previously been implanted with either phosphorus or arsenic ions. These boron ions are depicted schematically in the drawing by positive signs.

Figure 5:
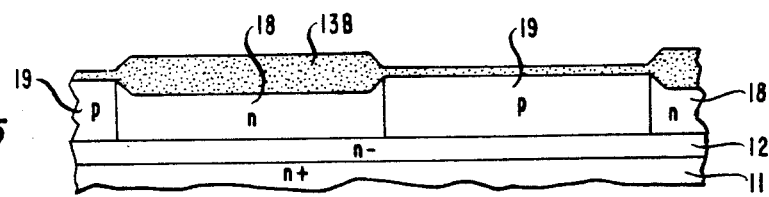

The wafer is then heated for a time and temperature adequately to drive the implanted ions into the silicon wafer essentially to the depth desired for the n-tubs 18 and p-tubs 19, as seen in FIG. 5. Typically, this is about 3 microns for each of the two tubs. Typically, this drive-in is done by heating at 1150 degrees C. for 2 hours in a nonoxidizing ambient of 95% nitrogen and 5% oxygen. This drive-in uses the highest thermal cycle of the process. While there will be further heating steps, such heating is chosen to be such as to produce relatively minor movement of these ions.

In particular, it is a characteristic of the preferred embodiment of the invention that the field oxide growth step, which occurs later in the process, is done at high pressure to minimize the time and temperature needed to form the relatively thick field oxide to keep small further diffusions of these implanted ions.

Since this drive-in step results in significant diffusion of boron ions away from the surface deeper into the wafer, it is important to restore the boron concentration near the surface if the surface conductivity of the p-tub is to be high enough in the passive regions to provide good isolation after formation of the field oxide. To this end, there follows a second boron implant using the same mask as the first boron implant. This second boron implant uses a dosage of $2 \times 10^{12}$ ions per square cm. at an accelerating voltage of 75 k. electron volts. Since these ions will not be subjected to any extended high thermal cycle, these ions will be retained close to the surface of the p-type tubs 19. Moreover, since the thick oxide regions 13B still remain over the n-tubs 18, little of this second boron implantation will enter the n-tubs.

Next there is removed essentially all of the oxide on the surface of the wafer, since such oxide tends to be contaminated with some of the implanted ions, and it is desirable to avoid the possibility of such ions diffusing into the silicon in subsequent processing.

Figure 6:
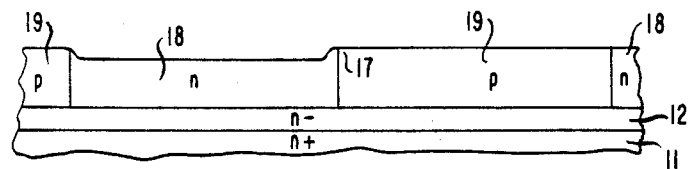

The resultant is shown in FIG. 6. As previously mentioned, at the wafer surface there results a ledge 17 at each interface between an n-tub 18 and a p-tub 19, and these ledges are useful as reference points in subsequent processing.

Next there needs to be defined the passive regions and the active regions of each tub. To this end, there is reformed a composite of a silicon oxide layer and a silicon nitride layer, essentially of the same kind as earlier layers 13 and 14. Then lithographic techniques are used to remove the silicon nitride in regions where the field oxide is to be formed, leaving exposed the silicon oxide. Then follows the high pressure oxidation step used to form the thick field oxide, typically about several thousand Angstroms thickness, with little further movement of the implanted ions. To this end, the wafer is heated to about 950 degrees C. for 10 minutes, under which conditions little movement of previously implanted ions occurs, in an ambient of 25 atmospheres of steam. This high pressure more than compensates for the relatively low temperature and short times to make possible the thick oxide layers needed for the field oxide. Of course, other combinations of high pressure, thermal cycles and oxidizing agents can be used, although it is usually desirable to use temperatures well below 1000 degrees C. to ensure little movement.

Next, the remaining nitride is etched away and then the wafer is also advantageously exposed to an oxide etchant to remove the thin oxide where the nitride had been and also to round off somewhat the bird-beak's geometry at the edges of the field oxide, while leaving most of the field oxide intact.

Figure 7:
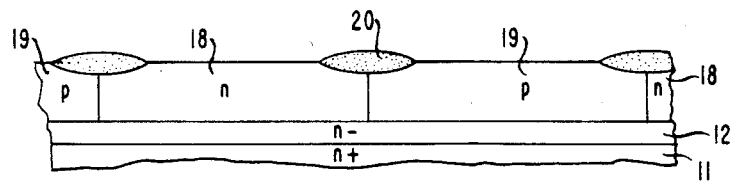

The resultant is shown in FIG. 7. Thick oxide regions 20 overlie the regions where the p-n junctions formed at the interfaces of tubs 18 and 19 intersect the surface. Since, as mentioned above, there is illustrated the situation where only a single transistor is being formed in each tub, there is no need for a field oxide region to overlie passive regions between separate transistors in a single tub. However, in instances where several transistors are formed in a single tub, it will usually prove desirable to form field oxide regions over the passive regions of the wafer between individual ones of such several transistors.

In some instances, an alternative procedure for forming the field oxide may be preferred to avoid the bird's beak shape for the field oxide. In this other procedure, the wafer, as seen in FIG. 6, is treated to form an oxide layer of thickness suitable for use as the field oxide nonselectively over the entire wafer. The treatment can be essentially the same high pressure, low-thermal cycle process previously described. After such formation, the oxide layer is patterned in the usual fashion to expose the regions where the transistors are to be formed to achieve a resultant essentially the same as shown in FIG. 7, except that the field oxide regions will be more rectangular than beak-shaped.

As discussed in an earlier application Ser. No. 365,396, filed Apr. 5, 1982, now U.S. Pat. No. 4,435,895 by L. C. Parrillo, G. W. Reutlinger, and L. Wang, now U.S. Pat. No. 4,435,895 having a common assignee as the instant application, an oxide growing into a silicon wafer has a tendency to sweep into the oxide boron ions present in the silicon being consumed, whereas it tends to pile up in the silicon in front of the advancing oxide phosphorus and arsenic ions. This complicates the control of the profiles of donor and acceptor ions underlying the oxide and, particularly, along the interface between the p-type and n-type tubs. The double implants in the two tubs serve to make possible a favorable profile in each tub. In particular, as a result of these differences in impurity segregation, in the p-type tubs the acceptor (boron) surface concentration in the active regions will be higher than in the field regions, whereas in the n-tubs the donor (arsenic) surface concentration will be higher in the field regions than in the active regions. This will permit the breakdown voltage at the interface of the p-tubs and n-tubs to be kept reasonably high while still maintaining adequate doping under the field oxide. In particular, in the passive regions under the field oxide, the arsenic concentration in the n-tubs is about $6 \times 10^{16}$ per cm$^3$, and the boron concentration in the p-tubs about $5 \times 10^{16}$ per cm$^3$. In the active regions, the arsenic concentration in the n-tubs is about $4 \times 10^{16}$ per cm$^3$, while the boron concentration in the p-tubs is about $5 \times 10^{16}$ per cm$^3$.

Now all that remains to be done is to form the transistors in the active regions in a manner that involves little further movement of the impurities already implanted. A variety of techniques are known for this purpose. In the preferred embodiment, the transistors are formed in a novel fashion that permits different portions of a common boron-implanted polycrystalline layer to serve as the gate electrode both for the p-type and n-type transistors, while maintaining threshold voltages for the two types which are essentially equal in magnitude though opposite in sign, a result usually regarded as desirable.

Figure 8:
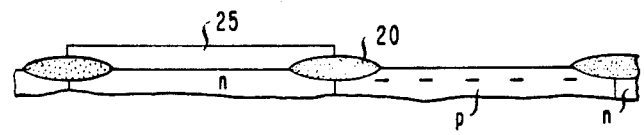

In this embodiment, as seen in FIG. 8, lithography is used to mask the n-tub with photoresist 25 preliminary to an implantation of arsenic ions denoted by negative signs into the active region of the p-tubs to adjust the threshold value of the n-channel transistors to be formed in such a tub. The arsenic implant is done with a flux of $1.2 \times 10^{12}$ ions per square cm. at an accelerating voltage of about 100 k. electron volts, resulting in an arsenic concentration near the surface of about $1 \times 10^{17}$ per cm$^3$.

Figure 9:
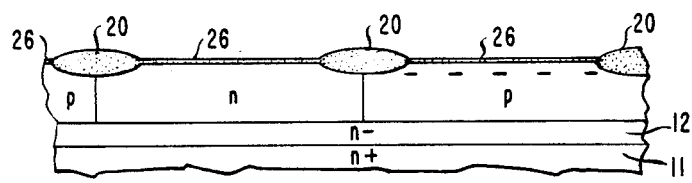

Then the wafer is treated to remove the photoresist and to clean the top surfaces of the active regions preliminary to forming the thin gate oxide over such active regions. After such treatment, there is formed a gate oxide about 250 Angstroms thick by heating in dry oxygen for thirty minutes at 900 degrees C. At this point the wafer has the appearance shown in FIG. 9 in which the passive regions of the wafer are covered with a thick field oxide 20 and the active regions with a thin oxide 26.

Next, over the entire wafer there is deposited in conventional fashion a layer of undoped polycrystalline silicone about 3500 Angstroms thick. The surface of this layer is then oxidized to form an oxide layer about 225 Angstroms thick by heating at about 900 degrees C. for about one hour in dry oxygen to provide a protective surface capping layer preliminary to boron ion implantation. Then boron is implanted with a flux of $4 \times 10^{15}$ ions per square cm. at 30 k. electron volts, followed by annealing at 950 degrees C. for thirty minutes in nitrogen to activate the boron.

There is then removed the protective surface oxide layer by etching and this is followed by the deposition of a layer of tantalum silicide (TaSi$_2$) about 2500 Angstroms thick in conventional fashion over the polysilicon.

This, in turn, is followed by a deposition by a low pressure chemical vapor process of about 2000 Angstroms of undoped silica glass which serves as a capping layer to protect the underlying layers during the subsequent processing.

Next the trilevel layer of polysilicon, tantalum silicide, and silica are patterned to define the gate electrodes which are localized appropriately in the active regions and any conductive runners to be used for interconnection, leaving exposed regions where source and drain regions are to be formed in both the p-type and n-type tubs. This is advantageously done by known photolithographic techniques. To avoid undercutting, reactive ion etching, in known fashion, is used to provide anisotropic etching and to achieve relatively vertical sidewalls where etching occurs.

This is followed by heating to sinter together the tantalum silicide and the polycrystalline silicon to ensure good adhesion. Typically heating the wafer in argon for about 30 minutes at 900 degrees C. is suitable.

Figure 10:
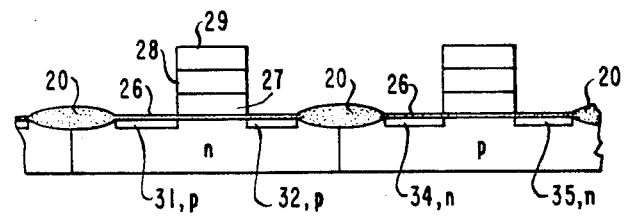

The resultant is seen in FIG. 10 in which the wafer is covered with a trilevel layer of boron-doped polysilicon 27, tantalum silicide 28, and silica 29 patterned to leave openings corresponding to where source and drains are to be formed in the active regions of the different tubs.

It is expected that the basic process just described may substitute other materials, such as molybdenum or tungsten, for the composite polycrystalline silicon and tantalum silicide for the common gate electrode.

There remains to dope the source and drain regions of the transistors. The source and drain regions advantageously are formed by ion implantation to achieve the geometry control important for high density arrays.

As is discussed in the previously-mentioned application, Ser. No. 365,396, now U.S. Pat. No. 4,435,895 it is possible to form the source and drain regions of both types of transistors with only a single masking if arsenic ions are implanted selectively only in the regions desired to form the n+ source and drain regions of the n-channel transistors formed in the p-tubs and a lesser dose of boron ions are implanted nonselectively in the source and drain regions of both types of transistors.

To this end, lithographic techniques in the usual manner are used to cover selectively the p-channel transistors before the arsenic implantation. There then follows arsenic implantation into exposed regions of the p-tubs where n+ source and drain regions are desired for the n-channel transistors. A flux of $10^{16}$ per square cm of arsenic ions at an accelerating field of 100 k. electron volts is suitable.

After the arsenic implantation, there is removed the photoresist covering the n-tubs, and the exposed regions comprising the source and drain regions of both tub types are implanted with boron ions. A flux of $2 \times 10^{15}$ boron difluoride ions at 50 k. electron volts is suitable for doping p+ the source and drain regions of the p- channel transistors in the n-tubs with little effect on the previously more heavily arsenic-doped source and drain regions of the n-channel transistors in the p-tubs. The use of the heavy boron difluoride ion ensures shallow penetration. The fluorine typically is quickly lost from the silicon and has little effect.

The resultant at this stage of the processing is shown in FIG. 10 in which the wafer is seen as supporting a patterned triple layer of polysilicon 27, tantalum silicide 28, and silica 29. The patterning includes openings 30 overlying the n-tub active region which have been boron-implanted to serve as p-type source/drain regions 31,32 for the p-channel transistor, and openings 33 overlying the p-tub active region which has been arsenic and boron implanted to serve as the n-type source/drain regions 34,35 for the n-channel transistor. The channels between the source/drain regions of each transistor are covered with a portion of the gate oxide layer 26 intermediate between the wafer and the triple layer.

As is well known, it is generally advantageous next to provide a protective silica glass (usually phosphorus-doped) over the surface of the wafer and to flow it by heating briefly at an elevated temperature (950 degrees C. is typical) to smooth out the topography. This heating also serves to activate the ions implanted in the source and drain regions.

Next, openings are formed in the glass layers and any surface oxide layers, in known fashion, to expose the wafer or runners where electrode connections are to be made to the source and drain regions and the gate electrodes, so that operating voltages may be applied. This normally is followed by the deposition of an aluminum layer, which contacts the wafer and the runners where openings were provided, and this aluminum is then patterned to define the desired interconnection pattern. Normally, additional conductive levels (not shown) will be provided for interconnection of the individual transistors into desired circuits.

Figure 11:
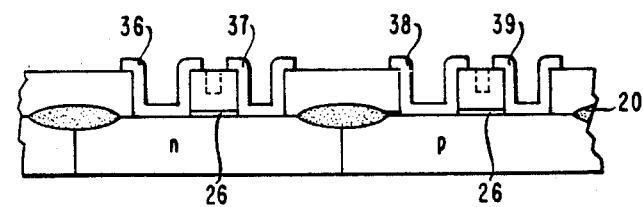

In FIG. 11, there is shown the resultant at this stage of the processing with aluminum layers 36, 37, 38 and 39 being shown contacting source/drain regions 31, 32, 34 and 35, respectively. As is well known, normally the connections to the gate electrodes will be made in a region displaced in a direction normal to the plane of the drawing, and for this reason they would not be seen in the section used in this figure. However, such connections are being shown in phantom in the drawing.

It can be appreciated that the specific embodiment described is merely illustrative of the principles of the invention and various modifications are possible consistent with its scope. In particular, the various specific values and particular materials are merely exemplary. Other combinations of fast and slow diffusing donors may be substituted for the phosphorus and aresenic. Similarly, it should be feasible to substitute other acceptors for boron.

What is claimed is:

1. A process forming a CMOS integrated circuit comprising preparing a silicon wafer which includes a surface layer of relatively high resistivity,
   providing a first mask over the surface of said wafer for masking regions where p-tubs are to be formed, leaving exposed regions where n-tubs are to be formed,
   implanting said exposed regions with fast and slow diffusing donor ions,
   replacing the first mask with a complementary second mask for masking those regions where n-tubs are to be formed,
   implanting the exposed regions with acceptor ions,
   heating the wafer for driving the implanted ions deeper into the wafer forming contiguous n-tubs and p-tubs over the surface of the wafer,
   while maintaining the complementary second mask, shallowly implanting additional acceptor ions into the p-tubs,
   removing the complementary second mask,
   forming a patterned field oxide over the surface of the wafer, leaving exposed the regions where transistors are to be formed without appreciable movement of the ions previously implanted, and
   forming transistors in the exposed regions.

2. A process for forming a CMOS integrated circuit comprising preparing a silicon wafer which includes a surface layer of relatively high resistivity,
   providing a mask over the surface of said wafer for masking regions where p-type tubs are to be formed, leaving exposed regions where n-type tubs are to be formed,
   implanting said exposed regions with a fast diffusing and a slow diffusing donor ion,
   removing the mask for exposing the surface of said wafer where p-type tubs are to be formed, and forming a mask over the remaining contiguous regions of the wafer where n-type tubs are to be formed,
   implanting acceptor ions into the exposed wafer where the p-type tubs are to be formed,
   heating the wafer for driving the implanted ions deeper into the wafer for forming n-type tubs in which the slow diffusing donor is the predominant dopant near the tub surface, and the fast diffusing donor is the predominant dopant in the deeper regions, and for forming p-type tubs in which the acceptor ions are the predominant dopant,
   while maintaining the same mask used in the earlier acceptor implantation implant shallowly implanting additional acceptor ions into the p-type tubs for increasing the acceptor concentration near the surface,
   removing the mask from the surface of the wafer,
   forming another mask over the surface leaving exposed regions where a relatively thick field oxide is desired over the surface of the wafer,
   heating the wafer in a high pressure ambient of an oxidizing agent at a temperature and for a time adequate to form a relatively thick field oxide over exposed regions of the wafer without significant further diffusion of the implanted ions within the wafer, and leaving a high concentration of slow diffusing ions immediately below the field oxide in the n-tubs and a high concentration of acceptor ions immediately below the field oxide in the p-type tubs, and
   forming n-channel transistors in the field oxide free regions of the p-tubs and p-channel transistors in the field oxide free regions of the n-type tubs.

3. The process of claim 2 in which arsenic or antimony is the slow diffusing donor, phosphorus the fast diffusing donor, and boron the acceptor, and arsenic or antimony is the predominant donor under the field oxide in the n-tubs and boron is the predominant acceptor under the field oxide in the p-tubs.

4. A process for forming a CMOS integrated circuit device comprising preparing a silicon wafer which includes a surface layer of relatively high resistivity, provided a mask over the surface of said wafer for masking regions where p-type tubs are to be formed, leaving exposed regions where n-type tubs are to be formed, implanting said exposed regions with phosphorus and arsenic or antimony ions, removing the mask for exposing the surface of said wafer where p-type tubs are to be formed, and forming a mask over the remaining contiguous regions of the wafer where n-type tubs are to be formed, implanting boron ions into the exposed wafer where the p-type tubs are to be formed, heating the wafer for driving the implanted ions deeper into the wafer for forming n-type tubs in which arsenic or antimony is the predominant dopant near the tub surface, and phosphorus is the predominant dopant in the deeper regions, and for forming contiguous p-type tubs in which boron is the predominant dopant, while maintaining the same mask used in the earlier boron implantation, implanting additional boron ions into the p-type tubs for increasing the boron concentration near the surface, removing the mask from the surface of the wafer, heating the wafer in a high pressure ambient of an oxidizing agent at a temperature and for a time adequate to form a relatively thick field oxide over desired regions of the wafer without significant further diffusion of the implanted ions within the wafer, thereby leaving a relatively high concentration of arsenic ions immediately below the field oxide in the n-tubs and a relatively high concentration of boron ions immediately below the field oxide in the p-type tubs, and forming n-channel transistors in the field oxide free regions of the p-tubs and p-channel transistors in the field oxide free regions of the n-type tubs.

5. In the manufacture of CMOS integrated circuits, a process for forming a silicon chip whose active surface includes a plurality of twin tubs of opposite conductivity type comprising the steps of preparing a silicon chip which includes a surface layer of relatively high resistivity compared to that desired for each of the twin tubs, forming over said chip a patterned layer of a first masking material, implanting phosphorus and either arsenic or antimony ions into said surface layer selectively at regions exposed through said patterned layer of the first masking material, forming over said chip a patterned layer of a second different masking material, its pattern being complementary to the earlier pattern whereby there is masked selectively the regions previously exposed, removing the patterned layer of the first material thereby exposing surface regions previously unexposed, implanting boron ions into the surface layer selectively at surface regions exposed to the openings in patterned layer of the second masking material, heating the silicon chip at a temperature and for a time to diffuse the implanted ions deeper into the chip and for forming contiguous p-type and n-type tubs of relatively lower resistivity than that of the unimplanted surface layer, and implanting additional boron ions into the surface layer selectively at surface regions exposed to openings in the patterned layer of the second masking material, for forming a relatively shallow high concentration of boron ions in the p-tubs.

6. In the manufacture of CMOS integrated circuits, the process of claim 5 in further combination with the steps of providing a field oxide over selected passive portions of said p-type and n-type tubs and forming n-channel transistors in the active portions of the p-tubs and p-channel transistors in the active portions of the n-tubs, these latter steps being accomplished in a manner to provide little further movement of the ions previously implanted in the chip.

7. In the manufacture of CMOS integrated circuits, the process of claim 6 in which the field oxide is first formed uniformly over the surface of the wafer and then patterned to leave it over passive portions of said p-type and n-type tubs.

8. In the manufacture of CMOS integrated circuits, the process of claim 6 in which a patterned mask is provided over the surface of the wafer and the field oxide is formed selectively only over those portions exposed by the pattern of the mask.

9. The process of claim 1 in which the forming of the n-channel and p-channel transistors comprises the steps of implanting the p-tubs selectively with a donor impurity for adjusting the threshold of the n-channel transistors, forming a gate oxide over the active portions of the two tubs, forming over the gate oxide a dual layer of boron-rich polycrystalline silicon and tantalum silicide, patterning the dual layer for forming the gate electrodes of the p-type and n-type transistors positioned in the active regions and leaving exposed regions where source and drain regions are to be formed implanting donor ions where the source and drain regions of the n-type transistors are to be formed and acceptor ions where the source and drain regions of the p-type transistors are to be formed and electrodes are provided to the source and drain electrodes of the transistors.

* * * * *